US010008350B2

(12) United States Patent
Quinsat et al.

(10) Patent No.: US 10,008,350 B2
(45) Date of Patent: Jun. 26, 2018

(54) MAGNETIC DEVICE

(71) Applicant: Toshiba Memory Corporation, Minato-ku (JP)

(72) Inventors: Michael Arnaud Quinsat, Yokohama (JP); Shiho Nakamura, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 591 days.

(21) Appl. No.: 14/546,099

(22) Filed: Nov. 18, 2014

(65) Prior Publication Data

US 2015/0243424 A1      Aug. 27, 2015

(30) Foreign Application Priority Data

Feb. 27, 2014   (JP) .................................. 2014-037569

(51) Int. Cl.
*G11C 11/14* (2006.01)
*H01H 47/00* (2006.01)
(Continued)

(52) U.S. Cl.
CPC ............. *H01H 47/00* (2013.01); *G11C 11/15* (2013.01); *G11C 11/161* (2013.01);
(Continued)

(58) Field of Classification Search
USPC ........................................................ 365/173
See application file for complete search history.

(56) References Cited

U.S. PATENT DOCUMENTS 8,120,127 B2   2/2012 Nagahara et al.
8,300,456 B2   10/2012 Honjou et al.
(Continued)

FOREIGN PATENT DOCUMENTS

EP      1 248 273 A2      10/2002
EP      2 276 034 A2      1/2011
(Continued)

OTHER PUBLICATIONS

Combined Taiwanese Office Action and Search Report dated Jun. 21, 2016 in Patent Application No. 103141084 (with Partial English language translation and English translation of categories of cited documents).
(Continued)

*Primary Examiner* — Ronald W Leja
(74) *Attorney, Agent, or Firm* — Oblon, McClelland, Maier & Neustadt, L.L.P.

(57) ABSTRACT

According to one embodiment, a magnetic device includes a first extending magnetic portion, a first conductive portion, a first inserted magnetic portion, and a first intermediate portion. The first extending magnetic portion is conductive, and includes a first magnetic region and a second magnetic region. The first magnetic region extends in a first extending direction, includes a first part, and has a first magnetization being changeable. The second magnetic region extends in the first extending direction, having a magnetization being changeable and different form the first magnetization. The first conductive portion is provided apart from the first part in a stacking direction intersecting the first extending direction. The first inserted magnetic portion is provided between the first conductive portion and the first part, and has a second magnetization being changeable. The first intermediate portion is provided between the first part and the first inserted magnetic portion.

20 Claims, 10 Drawing Sheets

(51) Int. Cl.
*H01F 10/32* (2006.01)
*G11C 11/15* (2006.01)
*G11C 11/16* (2006.01)
*G11C 11/56* (2006.01)

(52) U.S. Cl.
CPC ...... *G11C 11/1673* (2013.01); *G11C 11/1675* (2013.01); *G11C 11/5607* (2013.01); *H01F 10/3254* (2013.01); *H01F 10/3286* (2013.01); *G11C 2213/71* (2013.01)

(56) References Cited

U.S. PATENT DOCUMENTS

| | | |
|---|---|---|
| 8,315,087 B2 | 11/2012 | Katou et al. |
| 8,416,611 B2 | 4/2013 | Fukami et al. |
| 8,514,616 B2 | 8/2013 | Ishiwata et al. |
| 8,625,327 B2 | 1/2014 | Suzuki et al. |
| 2002/0186582 A1 | 12/2002 | Sharma et al. |
| 2010/0135072 A1 | 6/2010 | Reed et al. |
| 2010/0188890 A1 | 7/2010 | Fukami et al. |
| 2010/0193890 A1* | 8/2010 | Suzuki ............... B82Y 10/00 257/421 |
| 2011/0007561 A1 | 1/2011 | Berger et al. |
| 2011/0149649 A1 | 6/2011 | Hwang |
| 2011/0298067 A1 | 12/2011 | Ishiwata et al. |
| 2013/0039122 A1 | 2/2013 | Suzuki |
| 2013/0064009 A1 | 3/2013 | Kitano |
| 2013/0140660 A1 | 6/2013 | Fukami et al. |

FOREIGN PATENT DOCUMENTS

| | | |
|---|---|---|
| JP | 2000-195250 | 7/2000 |
| JP | 2003-30976 A | 1/2003 |
| JP | 2003-163330 A | 6/2003 |
| JP | 2006-278645 A | 10/2006 |
| JP | 2006-344653 A | 12/2006 |
| JP | 2012-510729 A | 5/2012 |
| WO | WO 2009/019947 A1 | 2/2009 |
| WO | WO 2010/065619 A1 | 6/2010 |
| WO | WO 2012/137911 A1 | 10/2012 |

OTHER PUBLICATIONS

Xuanyao Fong, et al., "Low-power Robust Complementary Polarizer STT-MRAM (CPSTT) for On-chip Caches", Memory Workshop (IMW), 2013 5$^{th}$ IEEE International, May 26-29, 2013, 4 pgs.

* cited by examiner

MAGNETIC DEVICE

CROSS-REFERENCE TO RELATED APPLICATIONS

This application is based upon and claims the benefit of priority from Japanese Patent Application No. 2014-037569, filed on Feb. 27, 2014; the entire contents of which are incorporated herein by reference.

FIELD

Embodiments described herein relate generally to a magnetic device.

BACKGROUND

There are memory devices and logic circuit devices using a semiconductor. Magnetic materials are used for the memory devices and logic circuit devices. A new configuration is desired for increasing density of these devices, for example.

DETAILED DESCRIPTION

Figures 1A, 1B:
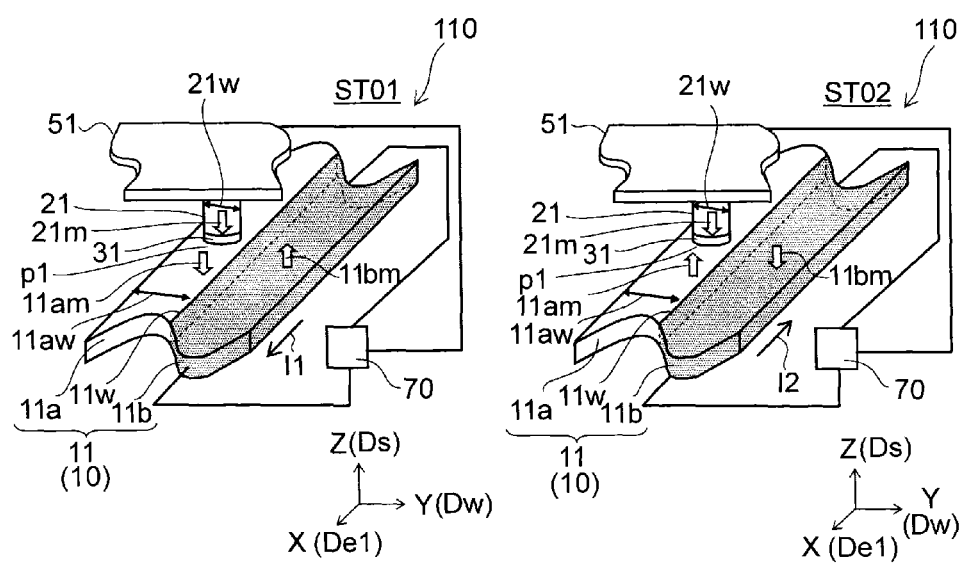
FIG. 1A and FIG. 1B are schematic perspective views showing a magnetic device according to a first embodiment.

According to one embodiment, a magnetic device includes a first extending magnetic portion, a first conductive portion, a first inserted magnetic portion, and a first intermediate portion. The first extending magnetic portion is conductive. The first extending magnetic portion includes a first magnetic region and a second magnetic region. The first magnetic region extends in a first extending direction, includes a first part, and has a first magnetization being changeable. The second magnetic region extends in the first extending direction, having a magnetization being changeable and different form the first magnetization. The first conductive portion is provided apart from the first part in a stacking direction intersecting the first extending direction. The first inserted magnetic portion is provided between the first conductive portion and the first part, and has a second magnetization being changeable. The first intermediate portion is provided between the first part and the first inserted magnetic portion.

Various embodiments will be described hereinafter with reference to the accompanying drawings.

The drawings are schematic or conceptual; and the proportions of sizes between portions and the like are not necessarily the same as the actual values thereof. The dimensions and the proportions may be illustrated differently among the drawings, even for identical portions.

In the drawings and the specification of the application, components similar to those described in regard to a drawing thereinabove are marked with like reference numerals, and a detailed description is omitted as appropriate.

First Embodiment

FIG. 1A and FIG. 1B are schematic perspective views illustrating a magnetic device according to a first embodiment.

These figures illustrate the configuration of the magnetic device 110 according to the embodiment. These figures also illustrate operating states different from each other. FIG. 1A shows a first state ST01. FIG. 1B shows a second state ST02.

As illustrated in FIG. 1A and FIG. 1B, a magnetic device 110 includes a first extending magnetic portion 11, a first conductive portion 51, a first inserted magnetic portion 21, and a first intermediate portion 31.

The first extending magnetic portion 11 is conductive. The first extending magnetic portion 11 includes a first magnetic region 11a and a second magnetic region 11b.

The first magnetic region 11a extends in a first extending direction De1. The first magnetic region 11a has a first magnetization 11am. The first magnetization 11am is changeable. The first magnetic region 11a has a first portion p1.

The second magnetic region 11b extends in the first extending direction De1. The second magnetic region 11b has a magnetization 11bm. The magnetization 11bm is changeable. The magnetization 11bm has a different direction from the first magnetization 11am. For example, the magnetization 11bm of the second magnetic region 11b is opposite to the first magnetization 11am.

For example, the first extending magnetic portion 11 extends in the first extending direction De1. A plurality of extending magnetic portions may be provided as recited below. These extending magnetic portions may serve as a wiring 10, for example.

In this example, the first extending magnetic portion 11 further includes a magnetic wall 11w. The magnetic wall 11w is provided between the first magnetic region 11a and the second magnetic region 11b. The magnetic wall 11w extends in the first extending direction De1.

The first conductive portion 51 is apart from the first portion p1 in a stacking direction Ds. The stacking direction Ds intersects the first extending direction De1. In this example, the first conductive portion 51 extends in a direction intersecting the first extending direction De1.

The first inserted magnetic portion 21 is provided between the first conductive portion 51 and the first portion p1. The first inserted magnetic portion 21 has a second magnetization 21m. The second magnetization 21m is changeable.

The first intermediate portion 31 is provided between the first portion p1 and the first inserted magnetic portion 21. The first intermediate portion 31 is non-magnetic, for example.

For example, the first extending direction De1 is taken to be an X-axis direction. The stacking direction Ds is taken to be a Z-axis direction. A direction perpendicular to the X-axis direction and the Z-axis direction is taken to be a Y-axis direction. In this example, the first conductive portion 51 extends along the Y-axis direction.

The first inserted magnetic portion 21 overlaps the first magnetic region 11a when projected onto the X-Y plane (a plane perpendicular to the stacking direction Ds). The first inserted magnetic portion 21 does not overlap the second magnetic region 11b when projected onto the X-Y plane.

For example, a direction intersecting the first extending direction De1 and intersecting the stacking direction Ds is taken to be a width direction Dw. The width direction Dw is perpendicular to the first extending direction De1 and perpendicular to the stacking direction Ds, for example. The width direction Dw is the Y-axis direction, for example.

A length 21w of the first inserted magnetic portion 21 along the width direction Dw is not more than a length flaw of the first magnetic region 11a along the width direction Dw. For example, the length 21w is shorter than the length claw.

For example, the first magnetization 11am of the first magnetic region 11a has a component along the stacking direction Ds. For example, the magnetization 11bm of the second magnetic region 11b has a component along the stacking direction Ds.

For example, the first magnetization 11am aligns along the stacking direction Ds. For example, the magnetization 11bm of the second magnetic region 11b aligns along the stacking direction Ds.

For example, a first current I1 flows in the first extending magnetic portion 11 in the first state ST01 illustrated in FIG. 1A. The first current I1 flows along the first extending direction De1. In first state ST01, the first magnetization 11am of the first magnetic region 11a is taken to be a first direction. In the example in FIG. 1A, the first direction is "downward", for example. In the first state ST01, the magnetization 11bm of the second magnetic region 11b is "upward."

In this specification, an expression of "downward" or "upward" is used to simplify the explanation. These words are not limited to the "bottom" or the "top" and indicate a state having opposite directions each other.

In the second state ST02 illustrated in FIG. 1B, a second current I2 flows in the first extending magnetic portion 11. The second current I2 flows in a direction opposite to the direction of the first current I1. In the second state ST02, the direction of the first magnetization 11am of the first magnetic region 11a is taken to be a second direction. In the example in FIG. 1B, the second direction is "upward", for example. In the second state ST02, the magnetization 11bm of the second magnetic region 11b is "downward."

Thus, the first direction (the direction of the first magnetization 11am of the first magnetic region 11a in the first state ST01) is opposite to the second direction (the direction of the first magnetization 11am of the first magnetic region 11a in the second state ST02).

The magnetization 11bm of the second magnetic region 11b in the first state ST01 is opposite to the magnetization 11bm of the second magnetic region 11b the in second state ST02.

For example, the magnetization 11bm of the second magnetic region 11b in the first state ST01 is opposite to the first direction. The magnetization 11bm of the second magnetic region 11b in the second state ST02 is opposite to the second direction.

On the other hand, the second magnetization 21m of the first inserted magnetic portion 21 has a component along the first magnetization 11am of the first magnetic region 11a, for example. For example, the second magnetization 21m aligns along the first magnetization 11am.

In the examples shown in FIG. 1A and FIG. 1B, the second magnetization 21m is "downward."

For example, the electric resistance between the first extending magnetic portion 11 and the first conductive portion 51 changes in accordance with the relation between the first magnetization 11am and the second magnetization 21m. For example, this change is based on a magnetoresistive effect.

The change of the electric resistance is used for an operation of a logic circuit, for example. The change of the electric resistance is used for memory of information, for example. For example, the magnetic device 110 is applicable to logic circuit devices. The magnetic device 110 is applicable to memory devices, for example. For example, information is stored by at least one selected from the first magnetization 11am and the second magnetization 21m.

As mentioned above, the magnetization in the first extending magnetic portion 11 changes with the current recited above, for example. In this example, the magnetic device 110 further includes a driver 70. The driver 70 is electrically connected to the first extending magnetic portion 11. A current can flow between the first extending magnetic portion 11 and the first conductive portion 51 as described later. The driver 70 may be further electrically connected with the first conductive portion 51.

The driver 70 is configured to supply the first current I1 and the second current I2 to the first extending magnetic portion 11. By the operation of the driver 70, the first state ST01 and the second state ST02 can be generated.

For example, the first magnetization 11am of the first magnetic region 11a and the magnetization 11bm of the second magnetic region 11b are formed by a magnetic field generated by the current. The direction of the first current I1 is opposite to the direction of the second current I2. Different magnetizations are formed by the direction of current. The formation of the magnetization is based on Oersted magnetic field, for example.

For example, there is a first reference sample in which a free layer, a reference layer, and an intermediate layer provided between the free layer and the reference layer are provided between two wirings. The electric resistance changes with the states of the magnetization of the free layer and the magnetization of the reference layer. In the first reference sample, the reference layer is provided in addition to the wirings.

On the other hand, in the magnetic device 110, the state of the electric resistance is obtained, for example, by the first magnetization 11am of the first magnetic region 11a and the second magnetization 21m of the first inserted magnetic portion 21. For example, the first extending magnetic portion 11 can function as a wiring. Accordingly, in the embodiment, the reference layer can be omitted. The device can be easily down-scaled.

On the other hand, there is a second reference sample in which a plurality of magnetic regions are arranged along the extending direction of a linear magnetic wiring. In this case, magnetic walls are orthogonal to the extending direction. In this second reference sample, the operation becomes complicated because the magnetic regions are formed arranged in the extending direction of the magnetic wiring. Therefore, the driver also becomes complicated.

On the other hand, in the embodiment, each of the plurality of magnetic regions extends in the extending direction of the magnetic wiring. That is, the first magnetic region 11a extends along the first extending direction De1. The magnetic wall extends along the first extending direction De1. In the embodiment, the magnetization of the magnetic region is controlled by the direction of the current, for example. Thereby, the magnetization can be controlled easily with high accuracy. The device can easily be downscaled.

According to the embodiment, a high-density magnetic device can be provided.

In the embodiment, a magnetic material having a perpendicular magnetic anisotropy can be used for the first extending magnetic portion 11, for example. In the magnetic material with the perpendicular magnetic anisotropy, the magnetization preferentially aligns along the stacking direction Ds. For example, the first extending magnetic portion 11 includes at least one selected from cobalt, iron, and nickel. For example, the first extending magnetic portion 11 may further include at least one element selected from chromium (Cr), zirconium (Zr), copper (Cu), ruthenium (Ru), terbium (Tb), silicon (Si), germanium (Ge), gallium (Ga), magnesium (Mg), manganese (Mn), bismuth (Bi), boron (B) and antimony (Sb), platinum (Pt), tantalum (Ta), tungsten (W), palladium (Pd), silver (Ag), iridium (Ir), gold (Au), aluminum (Al) and Gadolinium (Gd).

In the embodiment, a magnetic material having a perpendicular magnetic anisotropy can be used for the first inserted magnetic portion 21, for example. For example, the first inserted magnetic portion 21 includes at least one selected from cobalt, iron, and nickel. For example, the first inserted magnetic portion 21 may further include at least one element selected from chromium (Cr), zirconium (Zr), copper (Cu), ruthenium (Ru), terbium (Tb), silicon (Si), germanium (Ge), gallium (Ga), magnesium (Mg), manganese (Mn), bismuth (Bi), boron (B) and antimony (Sb), platinum (Pt), tantalum (Ta), tungsten (W), palladium (Pd), silver (Ag), iridium (Ir), gold (Au), aluminum (Al) and Gadolinium (Gd).

For example, an oxide can be used for the first intermediate portion 31. The first intermediate portion 31 may include preferentially Mg oxide, for example. Materials to increase the MR ratio can be used for the first intermediate portion 31. For example, the first intermediate portion 31 includes an oxide including at least one selected from aluminum (Al), titanium (Ti), tantalum (Ta), cobalt (Co), nickel (Ni), silicon (Si), magnesium (Mg) and iron (Fe). For example, the first intermediate portion 31 includes a nitride including at least one selected from aluminum (Al), titanium (Ti), tantalum (Ta), cobalt (Co), nickel (Ni), silicon (Si), magnesium (Mg) and iron (Fe). For example, the first intermediate portion 31 includes a fluoride including at least one selected from aluminum (Al), titanium (Ti), tantalum (Ta), cobalt (Co), nickel (Ni), silicon (Si), magnesium (Mg) and iron (Fe).

For example, the thickness of the first extending magnetic portion 11 is not less than 0.2 nm and not more than 400 nm. The thickness is the length along the Z-axis direction. The width of the first extending magnetic portion 11 is not less than 5 nm and not more 5000 nm, for example. The width (the length 11aw) of the first magnetic region 11a is not less than 5 nm and not more than 5000 nm, for example. The width of the second magnetic region 11b is not less than 5 nm and not more than 5000 nm, for example. The width of the magnetic wall 11w is not less than 1 nm and not more than 500 nm, for example. The width is the length along the Y-axis direction, for example. The length (the length along the X-axis direction) of the first extending magnetic portion 11 is not less than 0.01 micrometers and not more than 1000 micrometers, for example.

The thickness of the first inserted magnetic portion 21 is not less than 0.2 nm and not more than 400 nm, for example. The width (for example, the length 21w) of the first inserted magnetic portion 21 is not less than 5 nm and not more than 5000 nm, for example.

The thickness of the first intermediate portion 31 is not less than 0.5 nm and not more than 50 nm, for example.

The thicknesses, the widths and the lengths above-mentioned are examples. In the embodiment, these values are arbitrary.

In this example, the direction from the first magnetic region 11a toward the second magnetic region 11b intersects the first extending direction De1 and intersects the stacking direction Ds. In the embodiment, the direction from the first magnetic region 11a toward the second magnetic region 11b may be parallel to the stacking direction Ds. For example, the first magnetic region 11a may be provided between the second magnetic region 11b and the first conductive portion 51. Below, the case will be described where the direction from the first magnetic region 11a toward the second magnetic region 11b intersects the first extending direction De1 and intersects the stacking direction Ds.

In the magnetic device 110, four kinds of states are formed by the first magnetization 11am and the second magnetization 21m, for example. Hereinafter, the examples of these states are described.

FIG. 2A to FIG. 2D are schematic cross-sectional views illustrating the magnetic device according to the first embodiment.

Figures 2A, 2C:
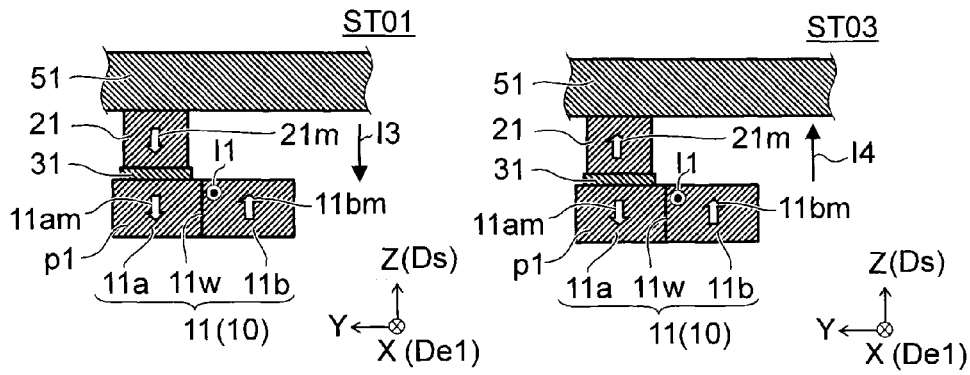
FIG. 2A to FIG. 2D are schematic cross-sectional views showing the magnetic device according to the first embodiment.

In the first state ST01 illustrated in FIG. 2A, the first current I1 flows. The first magnetization 11am is downward. The second magnetization 21m is downward. For example, the third current I3 is made to flow between the first extending magnetic portion 11 and the first conductive portion 51. The direction of the third current I3 aligns along a direction from the first conductive portion 51 toward the first extending magnetic portion 11, for example. For example, a spin transfer torque acts between the first magnetic region 11a and the first inserted magnetic portion 21. Thereby, the second magnetization 21m becomes a direction in accordance with the first magnetization 11am. In this case, the second magnetization 21m is the same as (parallel to) the first magnetization 11am.

Figures 2B, 2D:
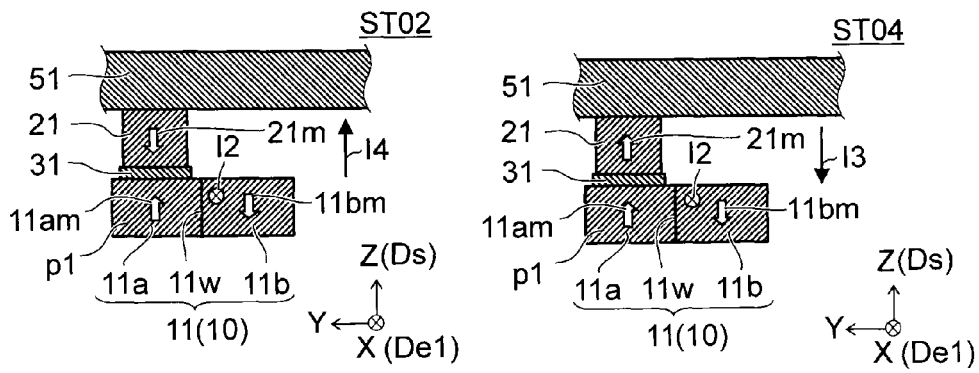

In the second state ST02 illustrated in FIG. 2B, the second current I2 flows. The first magnetization 11am is upward. The second magnetization 21m is downward. For example, the fourth current I4 is made to flow between the first extending magnetic portion 11 and the first conductive portion 51. The direction of the fourth current I4 aligns along a direction from the first extending magnetic portion 11 toward the first conductive portion 51. Also in this case, the spin transfer torque acts between the first magnetic region 11a and the first inserted magnetic portion 21. Thereby, the second magnetization 21m becomes a direction in accordance with the first magnetization 11am. In this case, the second magnetization 21m is opposite to the first magnetization 11am (that is, anti-parallel).

In the third state ST03 illustrated in FIG. 2C, the first current I1 flows. The first magnetization 11am is downward. The second magnetization 21m is upward. For example, the fourth current I4 is made to flow between the first extending magnetic portion 11 and the first conductive portion 51. The spin transfer torque acts also in this case. Thereby, the second magnetization 21m becomes a direction in accordance with the first magnetization 11am. In this case, the second magnetization 21m is opposite to the first magnetization 11am (that is, anti-parallel).

In the fourth state ST04 illustrated in FIG. 2D, the second current I2 flows. The first magnetization 11am is upward. The second magnetization 21m is upward. For example, the third current I3 is made to flow between the first extending magnetic portion 11 and the first conductive portion 51. The spin transfer torque acts also in this case. Thereby, the second magnetization 21m becomes a direction in accordance with the first magnetization 11am. In this case, the second magnetization 21m is the same as (parallel to) the first magnetization 11am.

For example, when the direction of the second magnetization 21m is the same as the direction of the first magnetization 11am, the electric resistance between the first extending magnetic portion 11 and the first conductive portion 51 is a first resistance. For example, when the direction of the second magnetization 21m is opposite to the direction of the first magnetization 11am, the electric resistance between the first extending magnetic portion 11 and the first conductive portion 51 is a second resistance. The second resistance differs from the first resistance. For example, the second resistance is higher than the first resistance.

For example, by using this change of the resistance, a logic circuit is obtained.

Figure 3:
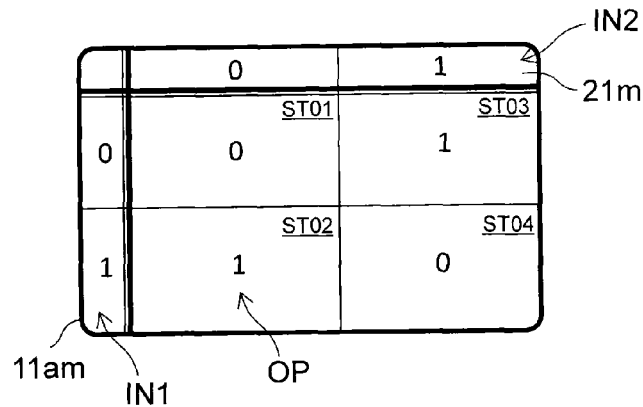
FIG. 3 is a schematic view showing the operation of the magnetic device according to the first embodiment.

FIG. 3 is a schematic view illustrating the operation of the magnetic device according to the first embodiment.

As illustrated in FIG. 3, two states of the first magnetization 11am are made to correspond to "0" and "1", for example. For example, the state where the first magnetization 11am is "downward" corresponds to "0." The state where the first magnetization 11am is "upward" corresponds to "1." For example, the state of the first magnetization 11am is set to a first input IN1.

For example, two states of the second magnetization 21m are made to correspond to "0" and "1." For example, the state where the second magnetization 21m is "downward" corresponds to "0." The state where the second magnetization 21m is "upward" corresponds to "1." The state of the second magnetization 21m is set to a second input IN2.

The electric resistance between the first extending magnetic portion 11 and the first conductive portion 51 becomes the first resistance or the second resistance. The first resistance (for example, low resistance) is made to correspond to "0." The second resistance (for example, high resistance) is made to correspond to "1." The state of electric resistance is set to an output OP.

The output OP becomes an exclusive OR (XOR) of the first input IN1 and the second input IN2. Namely, the electrical state between the first extending magnetic portion 11 and the first conductive portion 51 becomes the state in accordance with the exclusive OR of the first input IN1 of the first magnetization 11am and the second input IN2 of the second magnetization 21m. In this example, the magnetic device 110 can be used as a logic circuit of XOR.

Figures 4A, 4B:
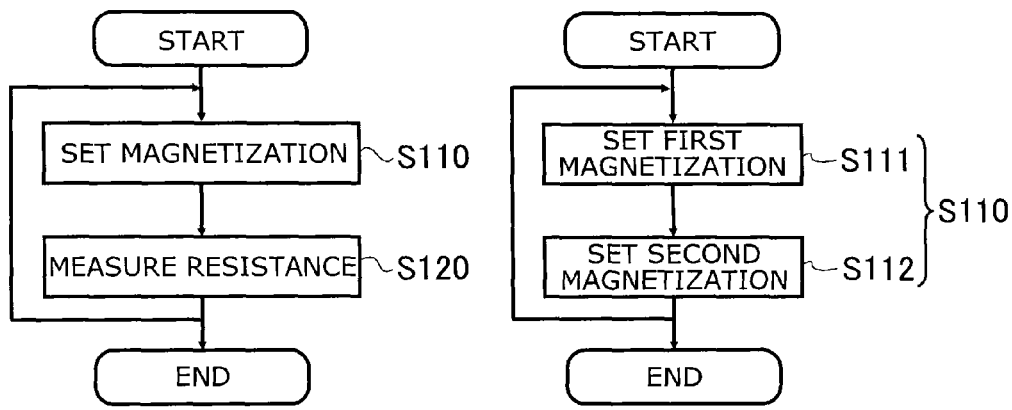
FIG. 4A and FIG. 4B are flow chart figures showing the operations of the magnetic device according to the first embodiment.

FIG. 4A and FIG. 4B are flow chart figures illustrating operations of the magnetic device according to the first embodiment.

The magnetization is set as illustrated in FIG. 4A (Step S110). The magnetization includes the first magnetization 11am and the second magnetization 21m, for example. The setting of the magnetization corresponds to a writing operation, for example. The writing operation includes an erasing operation.

Further, the resistance is measured (Step S120). That is, the resistance between the first extending magnetic portion 11 and the first conductive portion 51 is measured. This resistance changes based on the magneto-resistive effect. The measurement of the resistance corresponds to a reading operation, for example.

FIG. 4B illustrates the writing operation. For example, the first magnetization 11am is set (Step S111). For example, the first current I1 or the second current I2 is supplied to the first extending magnetic portion 11. The second magnetization 21m is set (Step S112). For example, the third current I3 or the fourth current I4 is supplied. In the embodiment, Step S111 and the step S112 can be replaced with each other.

Figure 5:
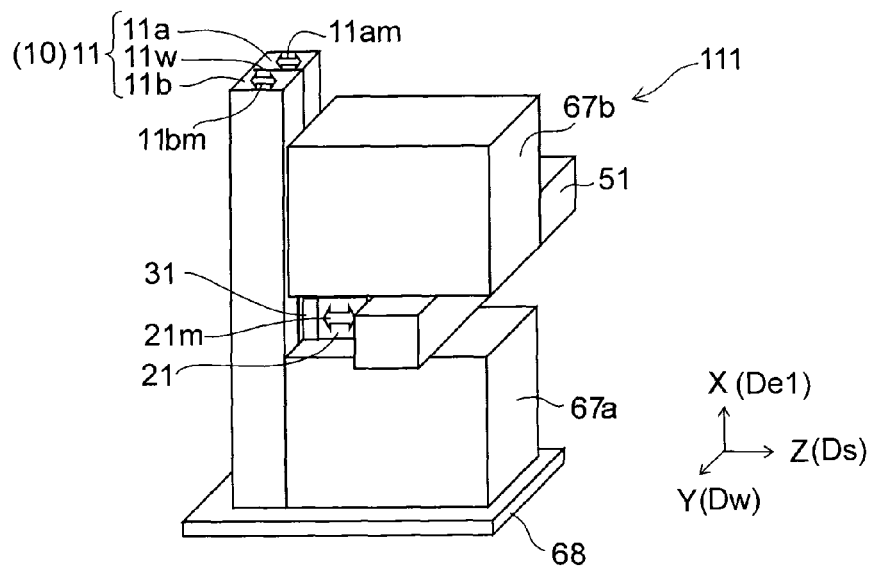
FIG. 5 is a schematic perspective view showing another magnetic device according to the first embodiment.

FIG. 5 is a schematic perspective view illustrating another magnetic device according to the first embodiment.

As shown in FIG. 5, in another magnetic device 111 according to the embodiment, a substrate 68 is further provided. On the substrate 68, the first extending magnetic portion 11, the first conductive portion 51, the first inserted magnetic portion 21, and the first intermediate portion 31 are provided. In this example, a major surface of the substrate 68 is substantially parallel to the Y-Z plane, for example. The first extending direction De1 is perpendicular to the substrate 68, for example.

In this example, the first insulating part 67a and the second insulating part 67b are provided. The first inserted magnetic portion 21 and the first intermediate portion 31 are disposed between the first insulating part 67a and the second insulating part 67b. In this example, the first conductive portion 51 is provided between the first insulating part 67a and the second insulating part 67b.

The embodiment is not limited thereto. The first extending direction De1 may be arbitrary with respect to the substrate 68.

Figure 6:
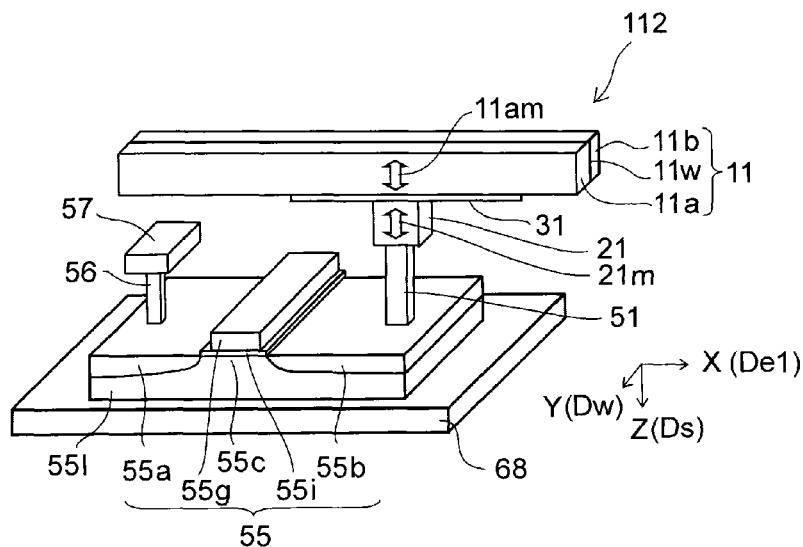
FIG. 6 is a schematic perspective view showing another magnetic device according to the first embodiment.

FIG. 6 is a schematic perspective view illustrating another magnetic device according to the first embodiment.

As shown in FIG. 6, in another magnetic device 112 according to this embodiment, a first switch element 55 is provided. In this example, a transistor is used as the first switch element 55. The first switch element 55 includes a first semiconductor region 55a, a second semiconductor region 55b, a channel region 55c, a gate 55g, and a gate insulating layer 55i, for example. The channel region 55c is provided between the first semiconductor region 55a and the second semiconductor region 55b. The gate insulating layer 55i is provided between the gate 55g and the channel region 55c. For example, the first semiconductor region 55a is a source region. The second semiconductor region 55b is a drain region, for example.

For example, the substrate 68 is provided. A semiconductor layer 55l is provided on the substrate 68. The first semiconductor region 55a, the second semiconductor region 55b, and the channel region 55c are provided on a part of the semiconductor layer 55l. Silicon may be used for these semiconductor regions, for example. The material of the semiconductor is arbitrary.

In this example, the first conductive portion 51 is disposed between the second semiconductor region 55b and the first extending magnetic portion 11. The first conductive portion 51 extends along the Z-axis direction, for example. The first conductive portion 51 is electrically connected with the second semiconductor region 55b.

In this example, a wiring 57 and a connecting part 56 are further provided. The connecting part 56 is provided between the wiring 57 and the first semiconductor region 55a. The wiring 57 is electrically connected with the first semiconductor region 55a through the connecting part 56.

For example, the electrical connection state between the wiring 57 and the first conductive portion 51 is controlled by a signal supplied to the gate 55g. Thereby, a desired writing operation and a desired reading operation can be performed.

In the embodiment, a diode may be used for the first switch element 55.

Second Embodiment

Figures 7A, 7B:
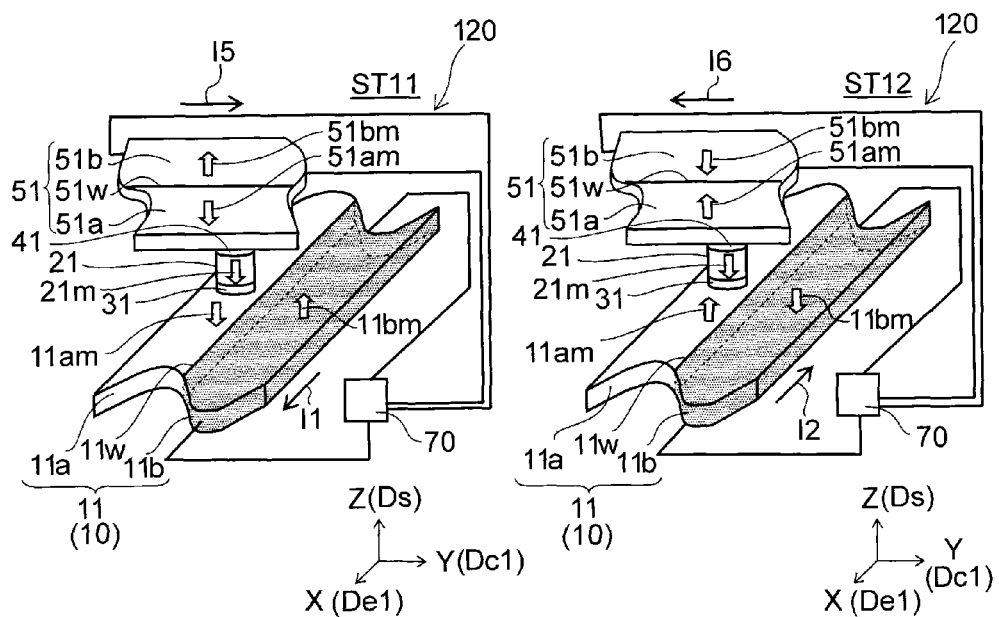
FIG. 7A and FIG. 7B are schematic perspective views showing a magnetic device according to a second embodiment.

FIG. 7A and FIG. 7B are schematic perspective views illustrating a magnetic device according to a second embodiment.

These figures illustrate the configuration of the magnetic device 120 according to the embodiment. These figures also illustrate two operating states different from each other. FIG. 7A shows a state ST11. FIG. 7B shows a state ST12.

As illustrated in FIG. 7A and FIG. 7B, the magnetic device 120 includes the first extending magnetic portion 11, the first conductive portion 51, the first inserted magnetic portion 21, and the first intermediate portion 31. In the magnetic device 120, the first conductive portion 51 includes a magnetic region 51a (a seventh magnetic region) and the magnetic region 51b (an eighth magnetic region). In this example, a first other-side intermediate portion 41 is provided between the magnetic region 51a and the first inserted magnetic portion 21. Further magneto-resistive effect between the magnetic region 51a and the first inserted magnetic portion 21 can be obtained, for example. The first other-side intermediate portion 41 is non-magnetic, for example. Other than this is same as that of the magnetic device 110. It is noted that the first other-side intermediate portion 41 may be disposed between the magnetic region 51b and the first inserted magnetic portion 21. Hereinafter, examples of these magnetic regions are explained.

The magnetic region 51a extends in a first conductive portion direction Dc1. The magnetic region 51a has a magnetization 51am. The magnetization 51am is changeable.

The first conductive portion direction Dc1 intersects the first extending direction De1. The first conductive portion direction Dc1 further intersects the stacking direction Ds. In this example, the first conductive portion direction Dc1 is perpendicular to the first extending direction De1. The first conductive portion direction Dc1 is perpendicular to the stacking direction Ds. The first conductive portion direction Dc1 is the Y-axis direction, for example.

The magnetic region 51b extends in the first conductive portion direction Dc1. The magnetic region 51b has a magnetization 51bm. The magnetization 51bm is changeable. The magnetization 51bm differs from the magnetization 51am. For example, the magnetization 51bm of the magnetic region 51b is opposite to the magnetization 51am of the magnetic region 51a.

The first conductive portion 51 extends in the first conductive portion direction Dc1. Namely, the first conductive portion 51 extends in the direction intersecting the first extending direction De1. The first inserted magnetic portion 21 is disposed between the first other-side intermediate portion 41 and the first intermediate portion 31. The first intermediate portion 31 is disposed between the first inserted magnetic portion 21 and the first magnetic region 11a. The first intermediate portion 31 may be disposed between the first inserted magnetic portion 21 and the second magnetic region 11b.

For example, the magnetic wall 51w is provided in the first conductive portion 51. The magnetic wall 51w is provided between the magnetic region 51a and the magnetic region 51b. The magnetic wall 51w extends in the first conductive portion direction Dc1.

For example, the magnetization 51am of the magnetic region 51a has a component along the stacking direction Ds. The magnetization 51bm of the magnetic region 51b has a component along the stacking direction Ds. For example, the magnetization 51am of the magnetic region 51a aligns along the stacking direction Ds. For example, the magnetization 51bm of the magnetic region 51b aligns along the stacking direction Ds.

For example, the magnetization 51am and the magnetization 51bm can be controlled by a current supplied to the first conductive portion 51.

A current I5 (a fifth current) flows in the first conductive portion 51 in the state ST11 illustrated in FIG. 7A. The current I5 aligns along the first conductive portion direction Dc1. At this time, the magnetization 51am of the magnetic region 51a is "downward", for example. The magnetization 51bm of the magnetic region 51b is "upward."

A current I6 (a sixth current) flows in the first conductive portion 51 in the state ST12 illustrated in FIG. 7B. The current I6 is reverse to the current I5. At this time, the magnetization 51am of the magnetic region 51a is "upward", for example. The magnetization 51bm of the magnetic region 51b is "downward."

That is, the magnetization 51am in the state ST11 is opposite to the magnetization 51am in the state ST12. The magnetization 51bm in the state ST11 is opposite to the magnetization 51bm in the state ST12.

The magnetization 51bm in the state ST11 is opposite to the magnetization 51am in the state ST11. The magnetization 51bm in the state ST12 is opposite to the magnetization 51am in the state ST12.

The current I5 and the current I6 can be supplied by the driver 70, for example. The magnetization 51am of the magnetic region 51a and the magnetization 51bm of the magnetic region 51b can be controlled by these currents.

In the magnetic device 120, MR ratio of a magneto-resistive effect can be further improved, for example. A stable operation can be performed. A stable operation is performed even when the device is down-scaled. The further down-scaling becomes possible in the magnetic device 120.

For example, the width of the first inserted magnetic portion 21 is not more than the width the magnetic region 51a. The width of the first inserted magnetic portion 21 is smaller than the width of the magnetic region 51a. The direction of the width of the magnetic region 51a is a direction perpendicular to the first conductive portion direction Dc1. The direction of the width of the first inserted magnetic portion 21 is the direction perpendicular to the first conductive portion direction Dc1.

For example, the first inserted magnetic portion 21 overlaps the magnetic region 51a when projected onto the X-Y plane. For example, the first inserted magnetic portion 21 does not overlap the magnetic region 51b when projected onto the X-Y plane, Third Embodiment FIG. 8A to FIG. 8C are schematics views illustrating a magnetic device according to a third embodiment.

Figure 8A:
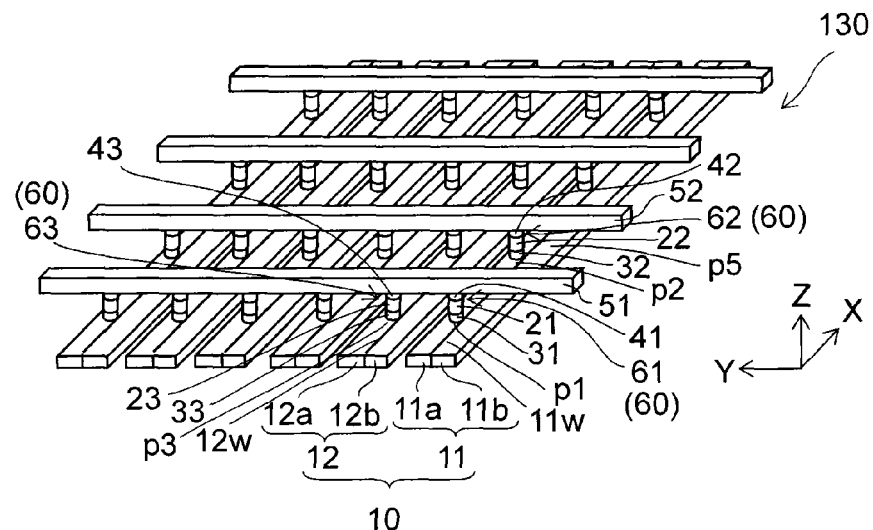
FIG. 8A to FIG. 8C are schematics views showing a magnetic device according to a third embodiment.
Figures 8B, 8C:
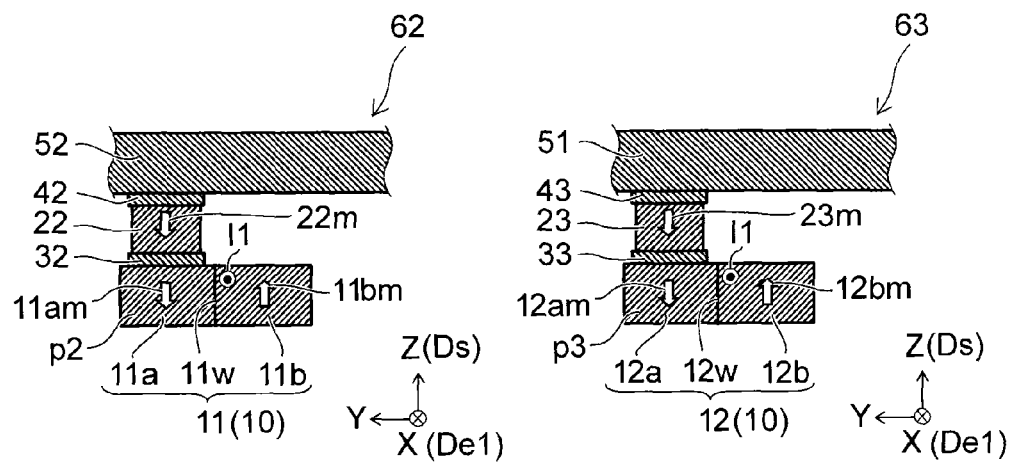

FIG. 8A is a schematic perspective view. FIG. 8B is a schematic cross-sectional view which illustrates a part of the device. FIG. 8C is a schematic cross-sectional view which illustrates another part of the device.

As illustrated to FIG. 8A, a magnetic device 130 according to the embodiment includes a plurality of elements 60. The plurality of elements 60 include a first element 61, a second element 62, a third element 63, etc., for example.

The first element 61 includes the first inserted magnetic portion 21, the first intermediate portion 31, and the first other-side intermediate portion 41, for example. The second element 62 includes a second inserted magnetic portion 22, a second intermediate portion 32, and a second other-side intermediate portion 42. The third element 63 includes a third inserted magnetic portion 23, a third intermediate portion 33, and a third other-side intermediate portion 43.

The first portion p1 of the first extending magnetic portion 11 is included in the first element 61. The second portion p2 of the first extending magnetic portion 11 is included in the second element 62. In this example, a second extending magnetic portion 12 is further provided. A part of the second extending magnetic portion 12 (a third portion p3) is included in the third element 63.

FIG. 8B illustrates the second element 62. The magnetic device 120 further includes a second conductive portion 52, the second inserted magnetic portion 22, the second intermediate portion 32, and the second other-side intermediate portion 42. The second inserted magnetic portion 22 has a magnetization 22m. The magnetization 22m is changeable.

The first magnetic region 11a includes the second portion p2. The second portion p2 is apart from the first portion p1 along the first extending direction De1.

The second conductive portion 52 is apart from the second portion p1 in the stacking direction Ds. In this example, the second conductive portion 52 extends in the Y-axis direction. The second conductive portion 52 is apart from the first conductive portion 51 in the first extending direction De1.

The second inserted magnetic portion 22 is disposed between the second portion p2 and the second conductive portion 52. The second intermediate portion 32 is disposed between the second portion p2 and the second inserted magnetic portion 22. The second other-side intermediate portion 42 is disposed between the second inserted magnetic portion 22 and the second conductive portion 52.

FIG. 8C illustrates the third element 63. The magnetic device 120 further includes the second extending magnetic portion 12, the third inserted magnetic portion 23, the third intermediate portion 33, and the third other-side intermediate portion 43. For example, the second extending magnetic portion 12 is included in the plurality of wirings 10. The second extending magnetic portion 12 is conductive. The second extending magnetic portion 12 includes a third magnetic region 12a and a fourth magnetic region 12b.

The third magnetic region 12a extends in the first extending direction De1. The third magnetic region 12a has a magnetization 12am. The magnetization 12am is changeable. The third magnetic region 12a includes the third portion p3.

The fourth magnetic region 12b extends in the first extending direction De1. The fourth magnetic region 12b has a magnetization 12bm. The magnetization 12bm is a direction different from the magnetization 12am of the third magnetic region 12a. The magnetization 12bm is changeable.

The third inserted magnetic portion 23 is provided between the first conductive portion 51 and the third portion p3. The third inserted magnetic portion 23 has a magnetization 23m. The magnetization 23m is changeable. The third other-side intermediate portion 43 is provided between the third inserted magnetic portion 23 and the first conductive portion 51.

The third intermediate portion 33 is provided between the third portion p3 and the third inserted magnetic portion 23.

The configuration of the second extending magnetic portion 12 is the same as the configuration of the first extending magnetic portion 11, for example. The material of the second extending magnetic portion 12 is the same as the material of the first extending magnetic portion 11, for example.

The configuration of the second conductive portion 52 is the same as the configuration of the first conductive portion 51, for example. The material of the second conductive portion 52 is the same as the material of the first conductive portion 51, for example.

The configuration of the second inserted magnetic portion 22 and the third inserted magnetic portion 23 is the same as that of the first inserted magnetic portion 21, for example. The material of the second inserted magnetic portion 22 and the third inserted magnetic portion 23 is the same as that of the first inserted magnetic portion 21, for example.

The configuration of the second intermediate portion 32 and the third intermediate portion 33 is the same as that of the first intermediate portion 31, for example. The material of the second intermediate portion 32 and the third intermediate portion 33 is the same as that of the first intermediate portion 31, for example.

The configuration of the second other-side intermediate portion 42 and the third other-side intermediate portion 43 is the same as that of the first other-side intermediate portion 41, for example. The material of the second other-side intermediate portion 42 and the third other-side intermediate portion 43 is the same as that of the first other-side intermediate portion 41, for example.

In the second element 62 and the third element 63, the same operation as the first element 61 can be performed. By providing the plurality of elements 60, a plurality of memory cells are obtained, for example. For example, a plurality of logic circuits are obtained. In the second element 62, the second magnetic region 11b has a fifth portion p5. Then, the second inserted magnetic portion 22 may be provided between the fifth portion p5 and the second conductive portion 52. In the magnetic device 130, the first other-side intermediate portion 41, the second other-side intermediate portion 42, and the third other-side intermediate portion 43 may be omitted.

FIG. 9A to FIG. 9G are schematics views illustrating another magnetic device according to the third embodiment.

Figure 9A:
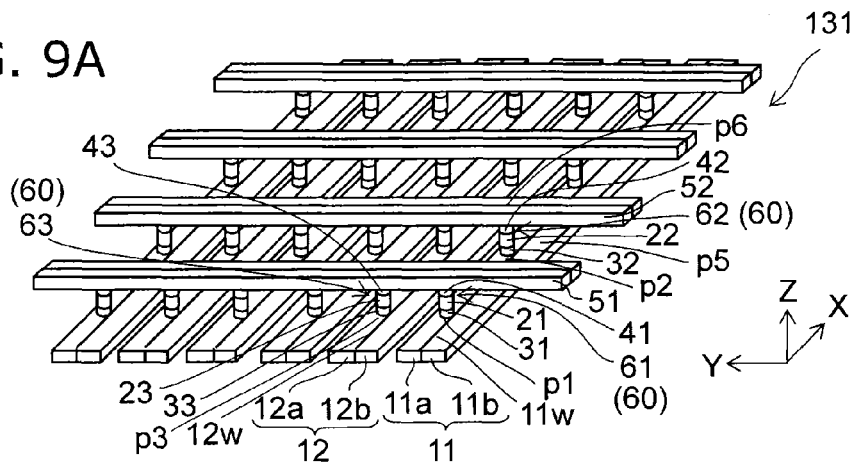
FIG. 9A to FIG. 9G are schematics views showing another magnetic device according to the third embodiment.

FIG. 9A is a schematic perspective view. FIG. 9B to FIG. 9G are schematic cross-sectional views illustrating parts of the device.

As illustrated in FIG. 9A, the magnetic device 131 according to the embodiment includes the plurality of elements 60. The plurality of elements 60 include the first element 61, the second element 62, and the third element 63, etc., for example.

Figure 9B:
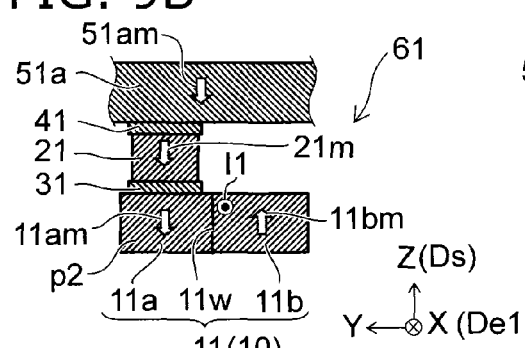
Figure 9E:
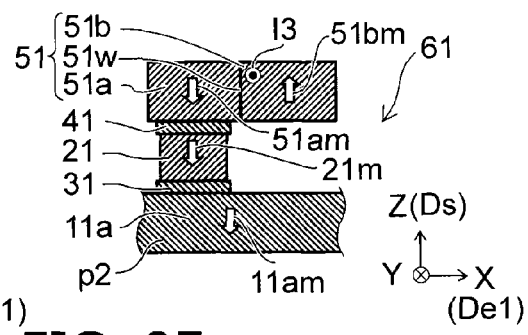
Figure 9C:
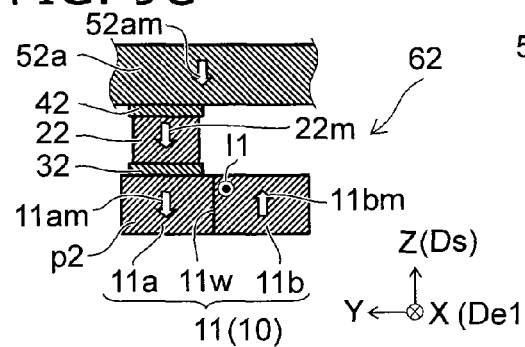
Figure 9F:
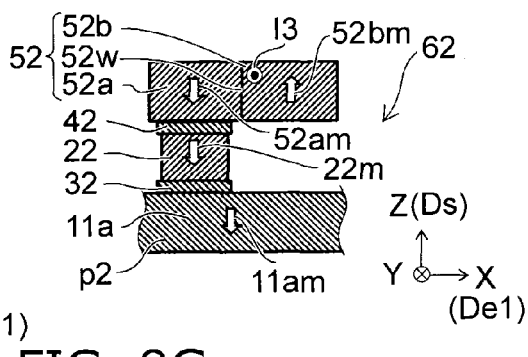
Figure 9D:
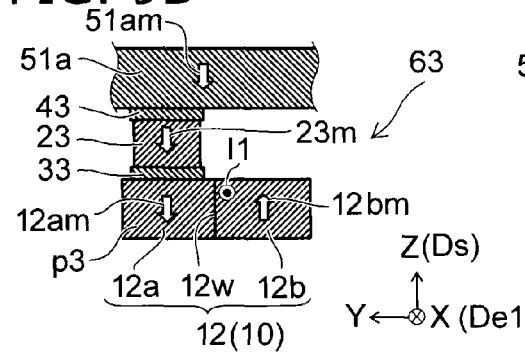
Figure 9G:
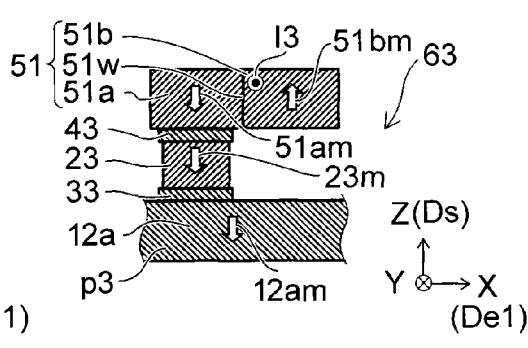

FIG. 9B and FIG. 9E illustrate a portion of the first element 61. The first element 61 includes the first inserted magnetic portion 21, the first intermediate portion 31, and the first other-side intermediate portion 41, for example. FIG. 9C and FIG. 9F illustrate a portion of the second element 62. The second element 62 includes the second inserted magnetic portion 22, the second intermediate portion 32, and the second other-side intermediate portion 42, for example. FIG. 9D and FIG. 9G illustrate a portion of the third element 63. The third element 63 includes the third inserted magnetic portion 23, the third intermediate portion 33, and the third other-side intermediate portion 43, for example.

As shown in these figures, in this example, the magnetic region 51a and the magnetic region 51b are provided in the first conductive portion 51. The magnetic region 52a and the magnetic region 52b are provided in the second conductive portion 52. The configurations described about the magnetic region 51a are applied to the magnetic region 52a. The configurations described about the magnetic region 51b are applied to the magnetic region 52b.

A high-density magnetic device can be provided also in the magnetic device 131.

In the second element 62, the second magnetic region 11b has the fifth portion p5. The magnetic region 52b has the sixth portion p6. Then, the second inserted magnetic portion 22 may be provided between the fifth portion p5 and the sixth portion p6.

Figure 10A:
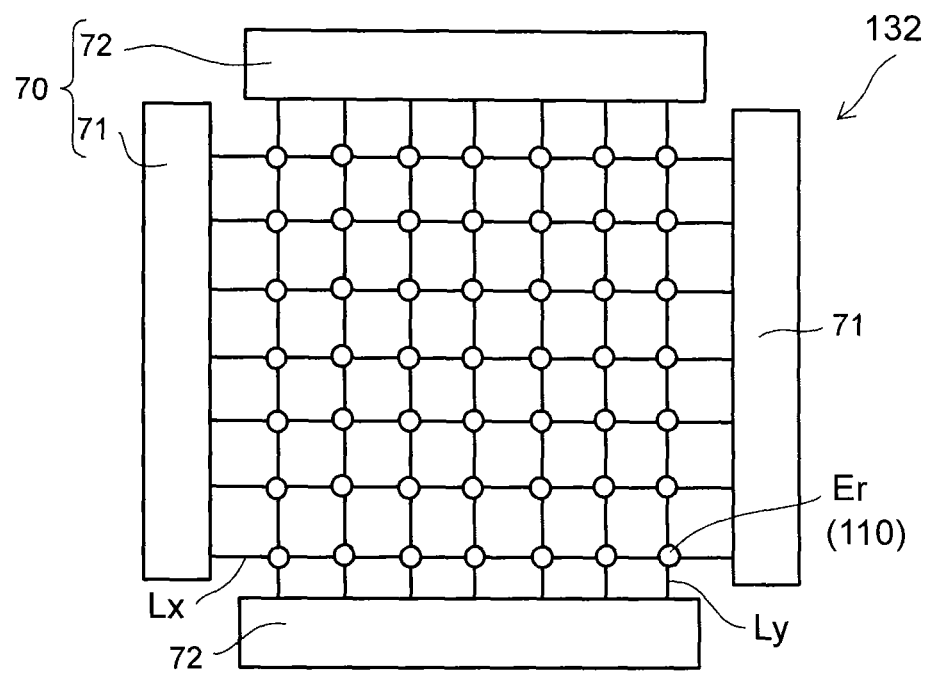
FIG. 10A and FIG. 10B are schematics views showing another magnetic device according to the third embodiment.
Figure 10B:
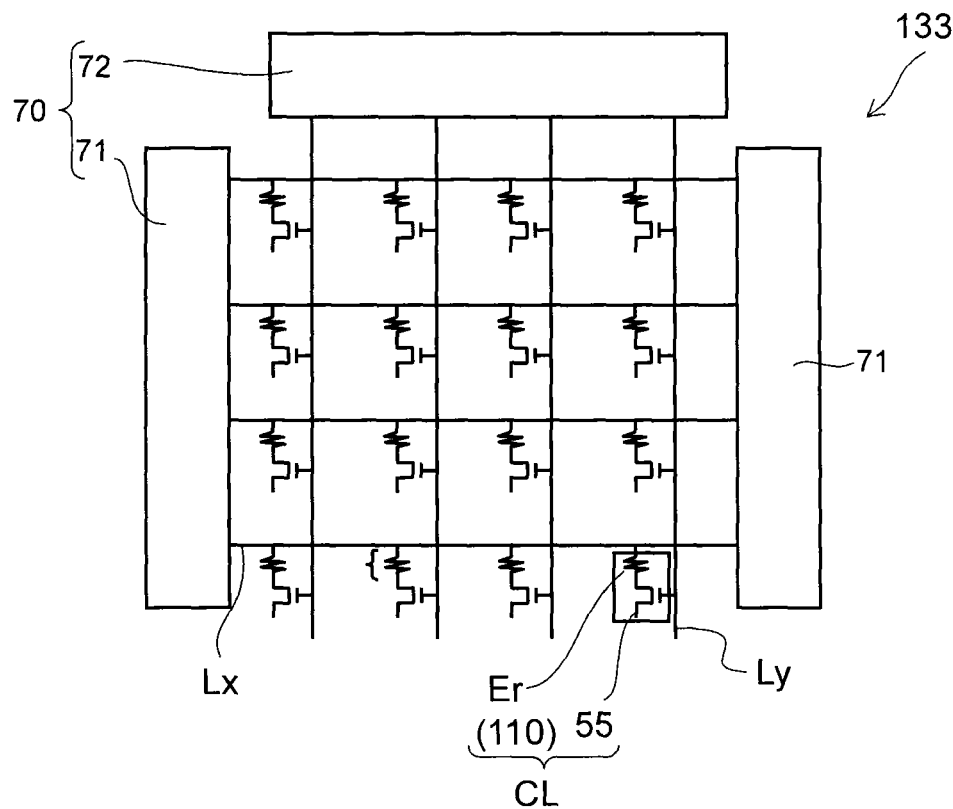

FIG. 10A and FIG. 10B are schematics views illustrating another magnetic device according to the third embodiment.

As shown in FIG. 10A, in the magnetic device 132 according to the embodiment, a plurality of first wirings Lx and a plurality of second wirings Ly are provided. Each of the plurality of first wirings Lx intersects each of the plurality of second wirings Ly. An element part Er is provided in each position between the plurality of first wirings Lx and the plurality of second wirings Ly, for example. As the element part Er, the magnetic device 110 is provided, for example. In this example, although the magnetic device 110 is provided, the magnetic devices according to the first embodiment and its variation may be used. The magnetic devices according to the second embodiment and its variation may be used.

For example, one of the first extending magnetic portion 11 and the first conductive portion 51 may be used for the first wiring Lx. For the second wiring Ly, other one of the first extending magnetic portion 11 and the first conductive portion 51 may be used. In this case, for example, the element part Er includes the first inserted magnetic portion 21 and the first intermediate portion 31. Further, the first other-side intermediate portion 41 may be provided. Wirings may be provided independently of the first extending magnetic portion 11 and the first conductive portion 51. In this case, at least one of the first extending magnetic portion 11 and the first conductive portion 51 is included in the element part Er.

In this example, a first circuit 71 and a second circuit 72 are provided. The first circuit 71 is electrically connected with the plurality of first wirings Lx. The second circuit 72 is electrically connected with the plurality of second wirings Ly. For example, the first circuit 71 is an X-line decoder, for example. The second circuit 72 is a Y-line decoder, for example. The potential of wiring (and a current) is controlled by these circuits. The operation of the element part Er (for example, magnetic device 110) is controlled by these circuits. These circuits are included in the driver 70.

As shown in FIG. 10B, in a magnetic device 133 according to the embodiment, the plurality of first wirings Lx, the plurality of second wirings Ly and a plurality of cell parts CL are provided. Each of the plurality of cell parts CL includes the element part Er and the first switch element 55.

The element part Er is connected with the first switch element 55 in one of the cell parts CL. The end of one of the cell parts CL is electrically connected with one of the first wirings Lx. The other end (for example, gate 55g of the first switch element 55) of one of the cell parts CL is electrically connected with one of the second wirings Ly.

By using the first switch element 55, a desired operated can be performed in arbitrary cell parts CL.

Fourth Embodiment

Figure 11:
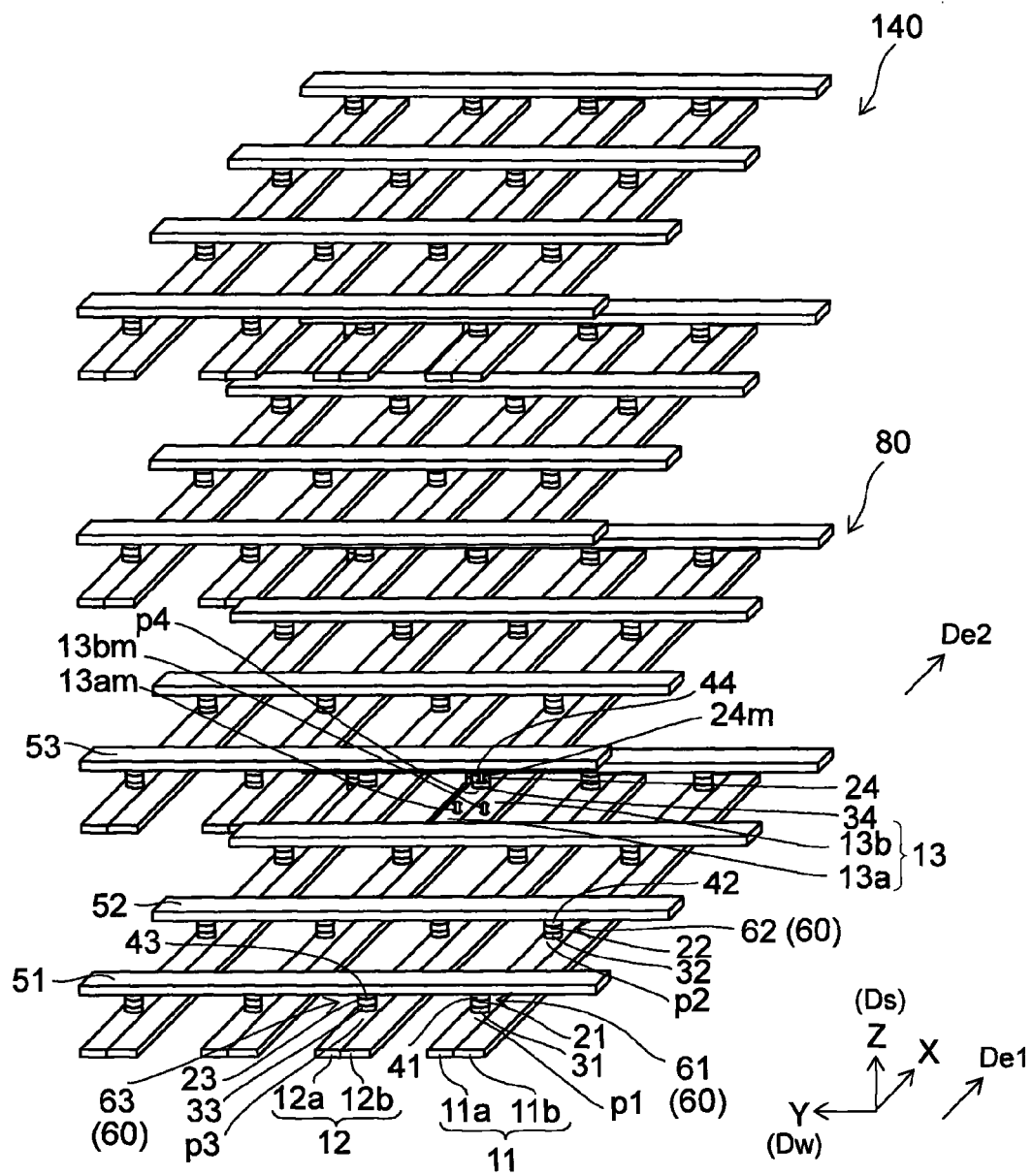
FIG. 11 is a schematic perspective view showing a magnetic device according to a fourth embodiment.

FIG. 11 is a schematic perspective view illustrating a magnetic device according to a fourth embodiment.

As shown in FIG. 11, in a magnetic device 140 according to the embodiment, the cells disposed in the X-Y plane are further stacked in the Z-axis direction.

For example, the magnetic device 140 further includes a structure 80 in addition to the first extending magnetic portion 11, the first conductive portion 51, the first inserted magnetic portion 21, the first intermediate portion 31, and the first other-side intermediate portion 41.

The structure 80 is apart from the first extending magnetic portion 11, the first conductive portion 51, the first inserted magnetic portion 21, the first intermediate portion 31, and the first other-side intermediate portion 41 along the stacking direction Ds.

The structure 80 includes a third extending magnetic portion 13, a third conductive portion 53, a fourth inserted magnetic portion 24, a fourth intermediate portion 34, and a fourth other-side intermediate portion 44.

The third extending magnetic portion 13 is conductive. The third extending magnetic portion 13 includes a fifth magnetic region 13a and a sixth magnetic region 13b. The fifth magnetic region 13a extends in a second extending direction De2. The fifth magnetic region 13a has a magnetization 13am. The magnetization 13am is changeable. The fifth magnetic region 13a includes a fourth portion p4.

The sixth magnetic region 13b extends in the second extending direction De2. The sixth magnetic region 13b has a magnetization 13bm. The magnetization 13bm is different from the magnetization 13am of the fifth magnetic region 13a. The magnetization 13bm is changeable.

The third conductive portion 53 is apart from the fourth portion p4 in the stacking direction Ds. The fourth inserted magnetic portion 24 is provided between the third conductive portion 53 and the fourth portion p4. The fourth inserted magnetic portion 24 has a magnetization 24m. The magnetization 24m is changeable. The fourth intermediate portion 34 is provided between the fourth portion p4 and the fourth inserted magnetic portion 24. The fourth other-side intermediate portion 44 is provided between the third conductive portion 53 and the fourth inserted magnetic portion 24.

In this example, the second extending direction De2 is substantially parallel to the first extending direction De1. The second extending direction De2 may be substantially perpendicular to the first extending direction De1, for example.

The same configuration and material as those of the first extending magnetic portion 11 can be applied to the third extending magnetic portion 13, for example. The same configuration and material as those of the first conductive portion 51 can be applied to the third conductive portion 53, for example. The same configuration and material as those of the first inserted magnetic portion 21 can be applied to the fourth inserted magnetic portion 24, for example. The same configuration and material as those of the first intermediate portion 31 can be applied to the fourth intermediate portion 34, for example. The same configuration and material as those of the first other-side intermediate portion 41 can be applied to the fourth other-side intermediate portion 44, for example.

In the magnetic device 140, the cells are disposed in a configuration of three dimensions. A high-density magnetic device can be provided.

In the magnetic device 140, the first other-side intermediate portion 41, the second other-side intermediate portion 42, the third other-side intermediate portion 43, and the fourth other-side intermediate portion 44 may be omitted.

Fifth Embodiment

Figure 12A:
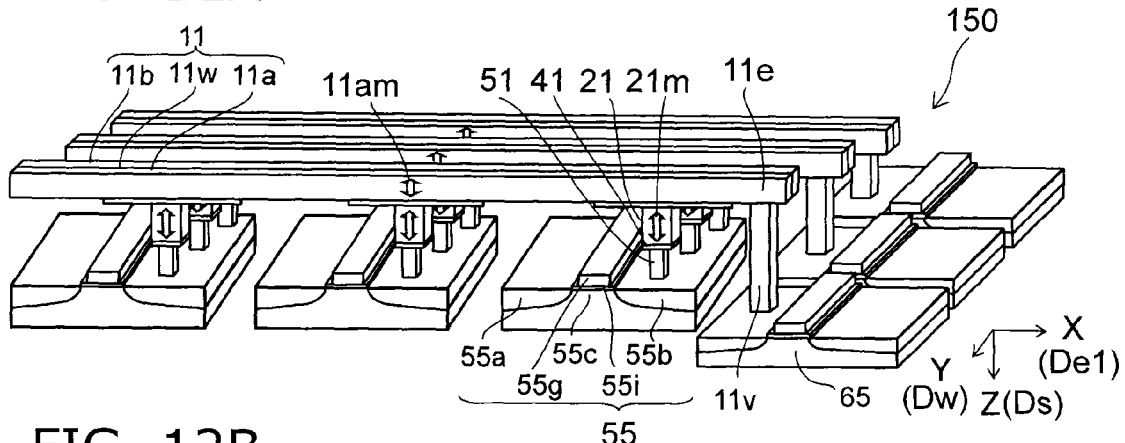
FIG. 12A to FIG. 12C are schematic perspective views showing a magnetic device according to a fifth embodiment.
Figure 12B:
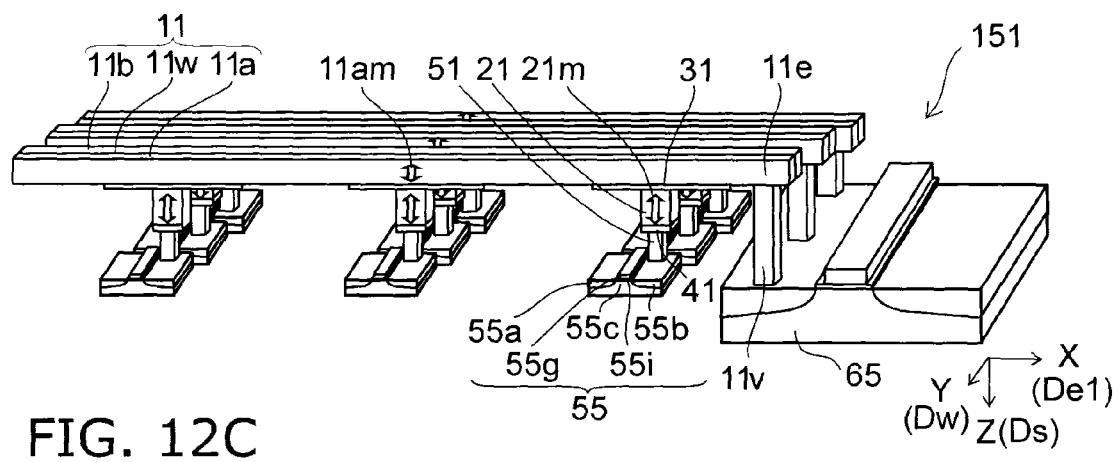
Figure 12C:
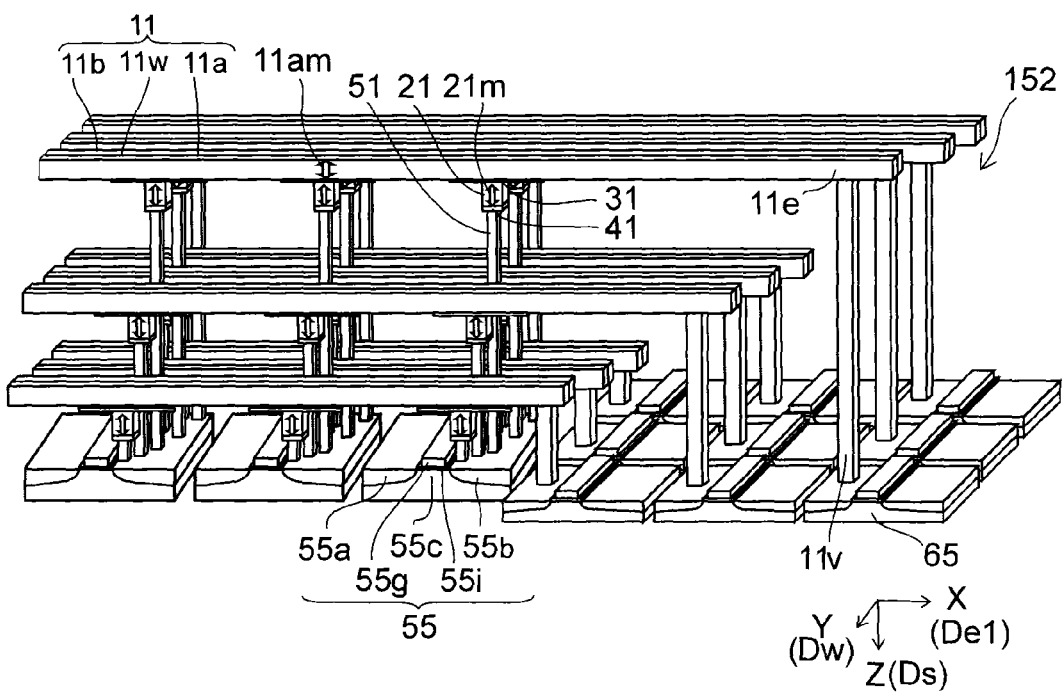

FIG. 12A to FIG. 12C are schematic perspective views illustrating a magnetic device according to a fifth embodiment.

As shown in FIG. 12A, in a magnetic device 150 according to the embodiment, an end 11e of the first extending magnetic portion 11 is electrically connected to a second switch element 65. In this example, a connection conductive portion 11v is provided between the end 11e of the first extending magnetic portion 11, and the second switch element 65. Thereby, the end 11e is connected with the second switch element 65. In this example, a plurality of extending magnetic portions (the first extending magnetic portion 11, for example) are provided. The plurality of second switch elements 65 are formed. Each of the plurality of extending magnetic portion is connected with each of the plurality of second switch elements 65. On the other hand, the plurality of conductive portions (the first conductive portion 51) is connected with one of the first switch elements 55. For example, the magnetic device 150 includes the first inserted magnetic portion 21, the first intermediate portion 31, and the first other-side intermediate portion 41.

As shown in FIG. 12B, in a magnetic device 151 according to the embodiment, the plurality of extending magnetic portions (the first extending magnetic portion 11 or the like) are connected with one of the second switch elements 65. The plurality of first switch elements 55 are provided. Each of the plurality of conductive portions (the first conductive portion 51 or the like) is connected to each of the plurality of first switch elements 55.

As shown in FIG. 12C, in a magnetic device 152 according to the embodiment, the configuration of the extending magnetic portions illustrated in FIG. 12A is stacked multiply along the stacking direction Ds.

In the magnetic device 150, 151, and 152, the first other-side intermediate portion 41 may be omitted.

Figure 13A:
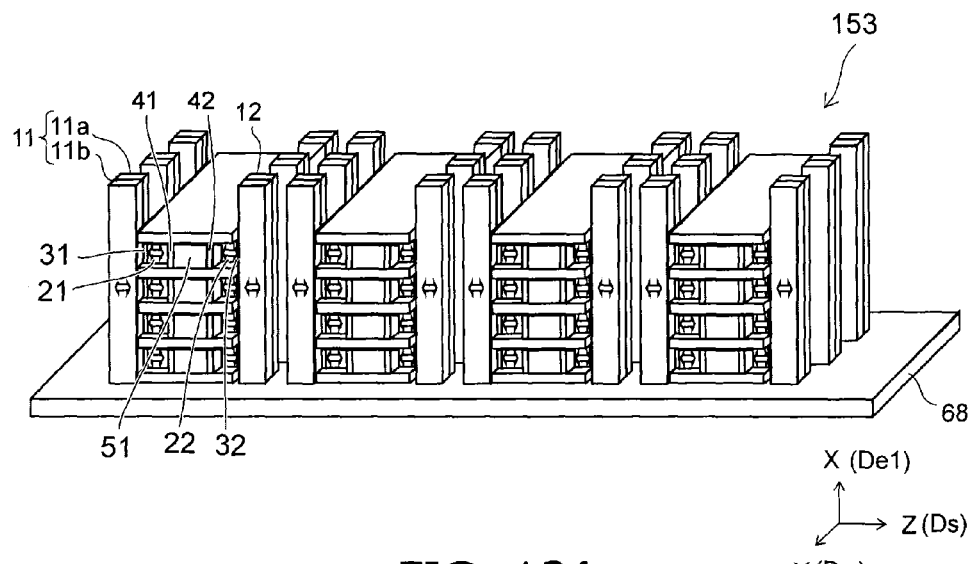
FIG. 13A and FIG. 13B are schematic perspective views showing another magnetic device according to the fifth embodiment.
Figure 13B:
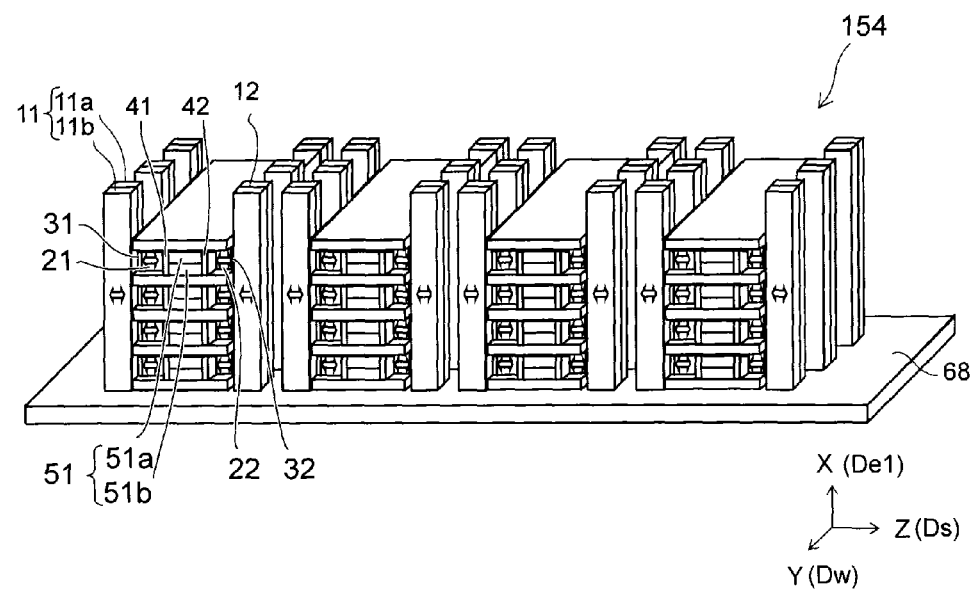

FIG. 13A and FIG. 13B are schematic perspective views illustrating another magnetic device according to a fifth embodiment.

As shown in FIG. 13A, the substrate 68 is provided in a magnetic device 153 according to the embodiment. The first extending direction De1 is substantially perpendicular to the major surface of the substrate 68. For example, the first conductive portion 51 is provided between the first extending magnetic portion 11 and the second extending magnetic portion 12. The first inserted magnetic portion 21 is provided between the first extending magnetic portion 11 and the first conductive portion 51. The second inserted magnetic portion 22 is provided between the second extending magnetic portion 12 and the first conductive portion 51. In this example, the first conductive portion 51 is shared by two cell parts. In the magnetic device 153, the first inserted magnetic portion 21, the first intermediate portion 31 and the first other-side intermediate portion 41 are provided.

As shown in FIG. 13B, in a magnetic device 154 according to the embodiment, the magnetic region 51a (a seventh magnetic region) and the magnetic region 51b (an eighth magnetic region) are provided in the first conductive portion 51. Other than this, the configurations are the same as those of the magnetic device 153.

A high-density magnetic device can be provided also in the magnetic devices 150 to 154.

According to embodiments, a high-density magnetic device can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic devices such as extending magnetic portions, conductive portions, inserted magnetic portions, intermediate portions, drivers, switch elements, and the like from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all magnetic devices practicable by an appropriate design modification by one skilled in the art based on the magnetic devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic device comprising:
a first extending magnetic portion being conductive, the first extending magnetic portion including
a first magnetic region, a length of the first magnetic region along a first extending direction being longer than a length of the first magnetic region along a first width direction crossing the first extending direction, the first magnetic region including a first part, the first magnetic region having a first magnetization being changeable,
a second magnetic region, a length of the second magnetic region along the first extending direction being longer than a length of the second magnetic region along the first width direction, the second magnetic region having a magnetization being changeable and different from the first magnetization, a direction from the first magnetic region toward the second magnetic region lying in a plane defined by the first extending direction and the first width direction;

a first conductive portion provided apart from the first part in a stacking direction crossing the plane including the first extending direction and the first width direction;

a first inserted magnetic portion provided between the first conductive portion and the first part, the first inserted magnetic portion having a second magnetization being changeable;

a first intermediate portion provided between the first part and the first inserted magnetic portion.

2. The magnetic device according to claim 1, wherein the magnetization of the second magnetic region is opposite to the first magnetization.

3. The magnetic device according to claim 1, wherein the first extending magnetic portion further includes a magnetic wall provided between the first magnetic region and the second magnetic region, the magnetic wall extending in the first extending direction.

4. The magnetic device according to claim 1, wherein the first magnetization has a component along the stacking direction, and
the magnetization of the second magnetic region has a component along the stacking direction.

5. The magnetic device according to claim 1, wherein the first magnetization aligns along the stacking direction, and
the magnetization of the second magnetic region aligns along the stacking direction.

6. The magnetic device according to claim 1, wherein the second magnetization aligns along the first magnetization.

7. The magnetic device according to claim 1, wherein a first direction of the first magnetization in a first state is opposite to a second direction of the first magnetization in a second state,
a first current flowing in the first extending magnetic portion along the first extending direction in the first state,
a second current flowing in the first extending magnetic portion in a direction opposite to the direction of the first current in the second state, and
the magnetization of the second magnetic region in the first state is opposite to the magnetization of the second magnetic region in the second state.

8. The magnetic device according to claim 7, wherein the magnetization of the second magnetic region in the first state is opposite to the first direction and
the magnetization of the second magnetic region in the second state is opposite to the second direction.

9. The magnetic device according to claim 7, further comprising a driver electrically connected with the first extending magnetic portion,
wherein the driver supplies the first current and the second current to the first extending magnetic portion.

10. The magnetic device according to claim 9, the driver further supplies a current flowing between the first extending magnetic portion and the first conductive portion.

11. The magnetic device according to claim 1, wherein an electrical state between the first extending magnetic portion and the first conductive portion is configured to be a state corresponding to an exclusive OR of a first input of the first magnetization and a second input of the second magnetization.

12. The magnetic device according to claim 1, wherein information is stored by at least one selected from the first magnetization and the second magnetization.

13. The magnetic device according to claim 1, wherein the first conductive portion extends in a direction crossing the first extending direction.

14. The magnetic device according to claim 1, wherein a length of the first inserted magnetic portion in the first width direction is not more than a length of the first magnetic region in the first width direction.

15. The magnetic device according to claim 1, wherein the first inserted magnetic portion does not overlap the second magnetic region when projected onto the plane.

16. The magnetic device according to claim 1, wherein the first inserted magnetic portion includes at least one selected from cobalt, iron, and nickel.

17. The magnetic device according to claim 1, further comprising:
a second conductive portion;
a second inserted magnetic portion; and
a second intermediate portion,
the first magnetic region including a second part provided apart from the first part in the first extending direction,
the second conductive portion being apart from the second part in the stacking direction,
the second inserted magnetic portion being disposed between the second part and the second conductive portion.

18. The magnetic device according to claim 1, further comprising:
a second extending magnetic portion being conductive, the second extending magnetic portion including
a third magnetic region extending the first extending direction, the third magnetic region including a third part, the third magnetic region having a magnetization being changeable,
a fourth magnetic region extending in the first extending direction, the fourth magnetic region having a magnetization being changeable and different from the magnetization of the third magnetic region,
a third inserted magnetic portion provided between a second conductive portion and the third part, the third inserted magnetic portion having a magnetization being changeable;
a third intermediate portion provided between the third part and the third inserted magnetic portion.

19. The magnetic device according to claim 1, further comprising:
a structural body provided apart from the first extending magnetic portion, the first conductive portion, the first inserted magnetic portion and the first intermediate portion,
the structural body including:
a third extending magnetic portion being conductive, the third extending magnetic portion including
a fifth magnetic region extending in a second extending direction, the fifth magnetic region including a fourth part, the fifth magnetic region having a magnetization being changeable,
a sixth magnetic region extending in the second extending direction, the sixth magnetic region having a magnetization being changeable and different form the fifth magnetization;
a third conductive portion provided apart from the fourth part in the stacking direction;
a fourth inserted magnetic portion provided between the third conductive portion and the fourth part, the fourth inserted magnetic portion having a magnetization being changeable; and a fourth intermediate portion provided between the fourth part and the fourth inserted magnetic portion.

20. The magnetic device according to claim 1, further comprising:

a fifth intermediate portion, the first conductive portion including a seventh magnetic region extending in a first conductive portion direction, the first conductive portion direction crossing a plane including the first extending direction and the stacking direction, the seventh magnetic region having a magnetization being changeable, an eighth magnetic region extending in the first conductive portion direction, the eighth magnetic region having a magnetization being changeable and different from the magnetization of the seventh magnetic region, and the fifth intermediate portion being disposed between the seventh magnetic region and the first inserted magnetic portion.

* * * * *